United States Patent
Kang et al.

(10) Patent No.: US 7,746,712 B2
(45) Date of Patent: Jun. 29, 2010

(54) SEMICONDUCTOR MEMORY DEVICE INCLUDING POST PACKAGE REPAIR CONTROL CIRCUIT AND POST PACKAGE REPAIR METHOD

(75) Inventors: Jae-sung Kang, Cheonan-si (KR);
Byung-heon Kwak, Suwon-si (KR);
Hyun-soon Jang, Seoul (KR);
Seung-whan Seo, Cheonan-si (KR);
Sang-joon Ryu, Asan-si (KR);
Hyun-tae Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 267 days.

(21) Appl. No.: 12/080,728

(22) Filed: Apr. 4, 2008

(65) Prior Publication Data
US 2008/0247243 A1    Oct. 9, 2008

(30) Foreign Application Priority Data
Apr. 5, 2007    (KR) .................... 10-2007-0033760

(51) Int. Cl.
*G11C 7/00*    (2006.01)
*G11C 29/00*    (2006.01)
(52) U.S. Cl. .................. 365/201; 365/189.07; 365/200; 714/718
(58) Field of Classification Search .................. 365/201
See application file for complete search history.

(56) References Cited

U.S. PATENT DOCUMENTS

| 5,265,055 | A | * | 11/1993 | Horiguchi et al. ............ 365/200 |
| 5,469,388 | A | * | 11/1995 | Park ........................... 365/200 |
| 6,212,118 | B1 | * | 4/2001 | Fujita .......................... 365/222 |
| 6,539,505 | B1 | | 3/2003 | Dahn |
| 6,625,072 | B2 | * | 9/2003 | Ohtani et al. ................ 365/200 |
| 6,704,228 | B2 | * | 3/2004 | Jang et al. ................... 365/200 |
| 6,788,596 | B2 | | 9/2004 | Kim et al. |
| 2003/0147291 | A1 | | 8/2003 | Kim et al. |

FOREIGN PATENT DOCUMENTS

| JP | 11-16385 | 1/1999 |
| KR | 20000077319 | 12/2000 |
| KR | 20030028595 | 4/2003 |
| KR | 10-0462877 | 8/2003 |
| KR | 1020040065776 | 7/2004 |
| KR | 10-2005-0121883 | 12/2005 |

* cited by examiner

*Primary Examiner*—Son L Mai
(74) *Attorney, Agent, or Firm*—Mills & Onello, LLP (57) ABSTRACT

Provided are a semiconductor memory device having a post package repair control circuit and a post package repair method. In the semiconductor memory device and the post package repair method, in a post package repair mode, a second memory bank is used as a fail bit map memory for storing failed bit information regarding a first memory bank, and the first memory bank is used as a fail bit map memory for storing failed bit information regarding the second memory bank.

24 Claims, 6 Drawing Sheets

300
SEMICONDUCTOR MEMORY DEVICE INCLUDING POST PACKAGE REPAIR CONTROL CIRCUIT AND POST PACKAGE REPAIR METHOD

CROSS-REFERENCE TO RELATED PATENT APPLICATIONS

This application claims the benefit of Korean Patent Application No. 10-2007-0033760, filed on Apr. 5, 2007, in the Korean Intellectual Property Office, the contents of which are incorporated herein in their entirety by reference.

BACKGROUND OF THE INVENTION

1. Field of the Invention

The present invention relates to a semiconductor memory device, and more particularly, to a semiconductor memory device having a post package repair control circuit and a post package repair method.

2. Description of the Related Art

In a conventional post package repair method related to a semiconductor memory device, a mass-production package test is conducted in order to identify and collect failed package memory products. Next, the failed package memory products are retested using expensive test equipment having a storage device, e.g., a fail bit map memory, and failed bit information regarding the memory cells in the failed package memory products is stored in the storage device, i.e., the fail bit map memory. The failed bit information is read from the fail bit map memory and then failed memory cells corresponding to the failed bit information are repaired. An example of a technique of repairing failed memory cells has been disclosed in U.S. Pat. No. 6,788,596 B2.

The conventional post package repair method not only requires expensive test equipment having a storage device (a fail bit map memory) but also requires a lot of time conducting a mass-production package test, retesting using the expensive test equipment, and then performing repairs. Accordingly, gains obtained by performing post package repairs are less than losses caused by using expensive test equipment having a fail bit map memory.

SUMMARY OF THE INVENTION

The present invention provides a semiconductor memory device capable of performing post package repairs without expensive test equipment having a fail bit map memory, thereby lowering manufacturing costs.

The present invention also provides a post package repair method capable of performing post package repairs without expensive test equipment having a fail bit map memory, thereby lowering manufacturing costs.

According to one aspect, the present invention is directed to a semiconductor memory device comprising a first memory bank; a second memory bank; and a post package repair control circuit comparing data read from the first memory bank with data received from the outside, providing comparison result data to the second memory bank in order to store the comparison result data in the second memory bank, determining whether a result of reading the comparison result data from the second memory bank contains abnormal data representing failed bits, and controlling failed memory cells included in the first memory bank to be repaired according to a result of the determination, in a post package repair mode.

In a post package repair mode, the second memory bank is used as a fail bit map memory for storing failed bit information regarding the first memory bank, and the first memory bank is used as a fail bit map memory for storing failed bit information regarding the second memory bank.

In one embodiment, the post package repair control circuit comprises: a comparison circuit comparing the data read from the first memory bank with the data received from the outside and providing a result of the comparing to the second memory bank, in response to a first control signal received in the post package repair mode; and a repair control circuit determining whether a result of reading the comparison result data read from the second memory bank contains abnormal data representing failed bits and then controlling failed memory cells included in the first memory bank to be repaired, in response to a second control signal received in the post package repair mode.

In one embodiment, the post package repair control circuit further comprises an address and command generator in which an address and a write command regarding the second memory bank are automatically generated if an address and a read command regarding the first memory bank received from the outside are input to the address and command generator in the post package repair mode; and the comparison result data is stored in the second memory bank in response to the address and the write command regarding the second memory bank.

According to another aspect, the invention is directed to a semiconductor memory device comprising: a first memory bank; a second memory bank; a first post package repair control circuit comparing first read data read from the first memory bank with first external data received from the outside, providing first comparison result data indicating a result of the comparing to the second memory bank in order to store the first comparison result data in the second memory bank, determining whether a result of reading the first comparison result data from the second memory bank contains abnormal data representing failed bits, and controlling failed memory cells included in the first memory bank to be repaired in a post package repair mode; and a second post package repair control circuit comparing second read data read from the second memory bank with second external data received from the outside, providing second comparison result data indicting a result of the comparing to the first memory bank in order to store the second comparison result data in the first memory bank, determining whether a result of reading the second comparison result data from the first memory bank contains abnormal data representing failed bits, and controlling failed memory cells included in the second memory bank to be repaired.

In one embodiment, the first post package repair control circuit comprises: a first comparison circuit comparing the first read data with the first external data and providing the first comparison result data indicating a result of the comparing to the second memory bank, in response to a first control signal received in the post package repair mode; and a first repair control circuit determining whether a result of reading the first comparison result from the second memory bank contains abnormal data representing failed bits and controlling failed memory cells included in the first memory bank to be repaired, in response to a second control signal received in the post package repair mode.

In one embodiment, the first post package repair control circuit further comprises a first address and command generator in which a second address and a first write command regarding the second memory bank are automatically generated if a first address and a first read command regarding the first memory bank received from the outside are input to the first address and command generator in the post package repair mode, and the first comparison result data is stored in the second memory bank in response to the second address and the first write command.

In one embodiment, the second post package repair control circuit comprises: a second comparison circuit comparing the second read data with the second external data and providing the second comparison result data indicating a result of the comparing to the first memory bank, in response to a third control signal received in the post package repair mode; and a second repair control circuit determining whether a result of reading the second comparison result data from the first memory bank contains abnormal data representing failed bits and controlling failed memory cells included in the second memory bank to be repaired, in response to a fourth control signal received in the post package repair mode.

In one embodiment, the second post package repair control circuit further comprises a second address and command generator in which a second address and a first write command regarding the first memory bank are automatically generated if a first address and a first read command regarding the second memory bank received from the outside are input to the second address and command generator in the post package repair mode. The second comparison result data is stored in the first memory bank in response to the second address and the first write command.

According to another aspect, the invention is directed to a semiconductor memory device comprising: a first memory bank and a second memory bank. In a post package repair mode, the second memory bank is used as a fail bit map memory for storing failed bit information regarding the first memory bank, and the first memory bank is used as a fail bit map memory for storing failed bit information regarding the second memory bank.

According to another aspect, the present invention is directed to a dual die package (DDP) memory device comprising a first memory chip, a second memory chip, and a post package repair control circuit. The post package repair control circuit compares data read from the first memory chip with data received from the outside, provides comparison result data indicating a result of the comparing to the second memory chip in order to store the comparison result data in the second memory chip, determines whether a result of reading the comparison result data from the second memory chip contains abnormal data representing failed bits, and controls failed memory cells included in the first memory chip to be repaired according to a result of the determination, in a post package repair mode.

In a post package repair mode, the second memory chip is used as a fail bit map memory for storing failed bit information regarding the first memory chip, and the first memory chip is used as a fail bit map memory for storing failed bit information regarding the second memory chip.

In one embodiment, the post package repair control circuit comprises: a comparison circuit comparing data read from the first memory chip with the data received from the outside, and providing comparison result data indicating a result of the comparing to the second memory chip, in response to a first control signal received in the post package repair mode; and a repair control circuit determining whether a result of reading the comparison result data from the second memory chip contains abnormal data representing failed bits and controlling failed memory cells included in the first memory chip to be repaired, in response to a first control signal received in the post package repair mode.

In one embodiment, the post package repair control circuit further comprises an address and command generator in which an address and a write command regarding the second memory chip are automatically generated if an address and a read command regarding the first memory chip received from the outside are input to the address and command generator in the post package repair mode; and the comparison result data is stored in the second memory chip in response to the address and the write command regarding the second memory chip.

According to another aspect, the invention is directed to a dual die package memory device comprising: a first memory chip; a second memory chip; a first post package repair control circuit comparing first read data read from the first memory chip with first external data received from the outside, providing first comparison result data indicating a result of the comparing to the second memory chip in order to store the first comparison result data in the second memory chip, determining whether a result of reading the first comparison result data from the second memory chip contains abnormal data representing failed bits, and controlling failed memory cells included in the first memory chip to be repaired, in a post package repair mode; and a second post package repair control circuit comparing second read data read from the second memory chip with second external data received from the outside, providing second comparison result data indicating a result of the comparing to the first memory chip in order to store the second comparison result data in the first memory chip, determining whether a result of reading the second comparison result data from the first memory chip contains abnormal data representing failed bits, and controlling failed memory cells included in the second memory chip to be repaired, in the post package repair mode.

In one embodiment, the first post package repair control circuit comprises: a first comparison circuit comparing the first read data with the first external data, and providing the first comparison result data indicating a result of the comparing to the second memory chip, in response to a first control signal received in the post package repair mode; and a first repair control circuit determining whether a result of reading the first comparison result data from the second memory chip contains abnormal data representing failed bits and controlling failed memory cells included in the first memory chip to be repaired, in response to a second control signal received in the post package repair mode.

In one embodiment, the first post package repair control circuit further comprises a first address and command generator in which a second address and a first write command regarding the second memory chip are automatically generated if a first address and a first read command regarding the first memory chip received from the outside are input to the first address and command generator in the post package repair mode, and the first comparison result data is stored in the second memory chip in response to the second address and the first write command.

In one embodiment, the second post package repair control circuit comprises: a second comparison circuit comparing the second read data with the second external data, and providing the second comparison result data indicating a result of the comparing to the first memory chip, in response to a third control signal received in the post package repair mode; and a second repair control circuit determining whether a result of reading the second comparison result data from the first memory chip contains abnormal data representing failed bits and controlling failed memory cells included in the second memory chip to be repaired, in response to a fourth control signal received in the post package repair mode.

In one embodiment, the second post package repair control circuit further comprises a second address and command generator in which a second address and a first write command regarding the first memory chip are automatically generated if a first address and a first read command regarding the second memory chip received from the outside are input to the second address and command generator in the post package repair mode, and the second comparison result data is stored in the first memory chip in response to the second address and the first write command.

According to another aspect, the invention is directed to a dual die package memory device comprising: a first memory chip; and a second memory chip. In a post package repair mode, the second memory chip is used as a fail bit map memory for storing failed bit information regarding the first memory chip, and the first memory chip is used as a fail bit map memory for storing failed bit information regarding the second memory chip.

According to another aspect, the present invention is directed to a post package repair method related to a semiconductor memory device having a first memory bank and a second memory bank, the method comprising: writing first data to the first memory bank and then reading the first data from the first memory bank; receiving first comparison data that is identical to the first data; comparing a result of reading the first data from the first memory bank with the first comparison data; storing first comparison result data containing failed bit information regarding the first memory bank in the second memory bank; reading the first comparison result data from the second memory bank; determining whether a result of reading the first comparison result data from the second memory bank contains abnormal data representing failed bit information; and, if it is determined that abnormal data representing failed bit information is included, repairing failed memory cells included in the first memory bank which correspond to the abnormal data.

In one embodiment, the method further comprises: writing second data to the second memory bank and then reading the second data from the second memory bank; receiving second comparison data that is identical to the second data; comparing a result of reading the second data from the second memory bank with the second comparison data; storing second comparison result data containing failed bit information regarding the second memory bank in the first memory bank; reading the second comparison result data from the first memory bank; determining whether a result of reading the second comparison result data from the first memory bank contains abnormal data representing failed bit information; and if it is determined that abnormal data representing failed bit information is included, repairing failed memory cells included in the second memory bank which correspond to the abnormal data.

The method is continuously performed while conducting a mass-production package test on the semiconductor memory device.

According to another aspect, the present invention is directed to a post package repair method related to a dual die package memory device having a first memory chip and a second memory chip, the method comprising: writing first data to the first memory chip and then reading the first data from the first memory chip; comparing a result of reading the first data from the first memory chip with first comparison data that is identical to the first data; storing first comparison result data containing failed bit information regarding the first memory chip in the second memory chip; reading the first comparison result data from the second memory chip; determining whether a result of reading the first comparison result data from the second memory chip contains abnormal data representing failed bit information; and, if it is determined that abnormal data representing failed bit information is included, repairing failed memory cells included in the first memory chip which correspond to the abnormal data.

In one embodiment, the method further comprises: writing second data to the second memory chip and then reading the second data from the second memory chip; comparing a result of reading the second data from the second memory chip with second comparison data that is identical to the second data; storing second comparison result data containing failed bit information regarding the second memory chip in the first memory chip; reading the second comparison result data from the first memory chip; determining whether a result of reading the second comparison result data from the first memory chip contains abnormal data representing failed bit information; and if it is determined that abnormal data representing failed bit information is included, repairing failed memory cells included in the second memory chip which correspond to the abnormal data.

The method is continuously performed while conducting a mass-production package test on the dual dip package memory device.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The present invention will now be described more fully with reference to the accompanying drawings, in which exemplary embodiments of the invention are shown.

Figure 1:
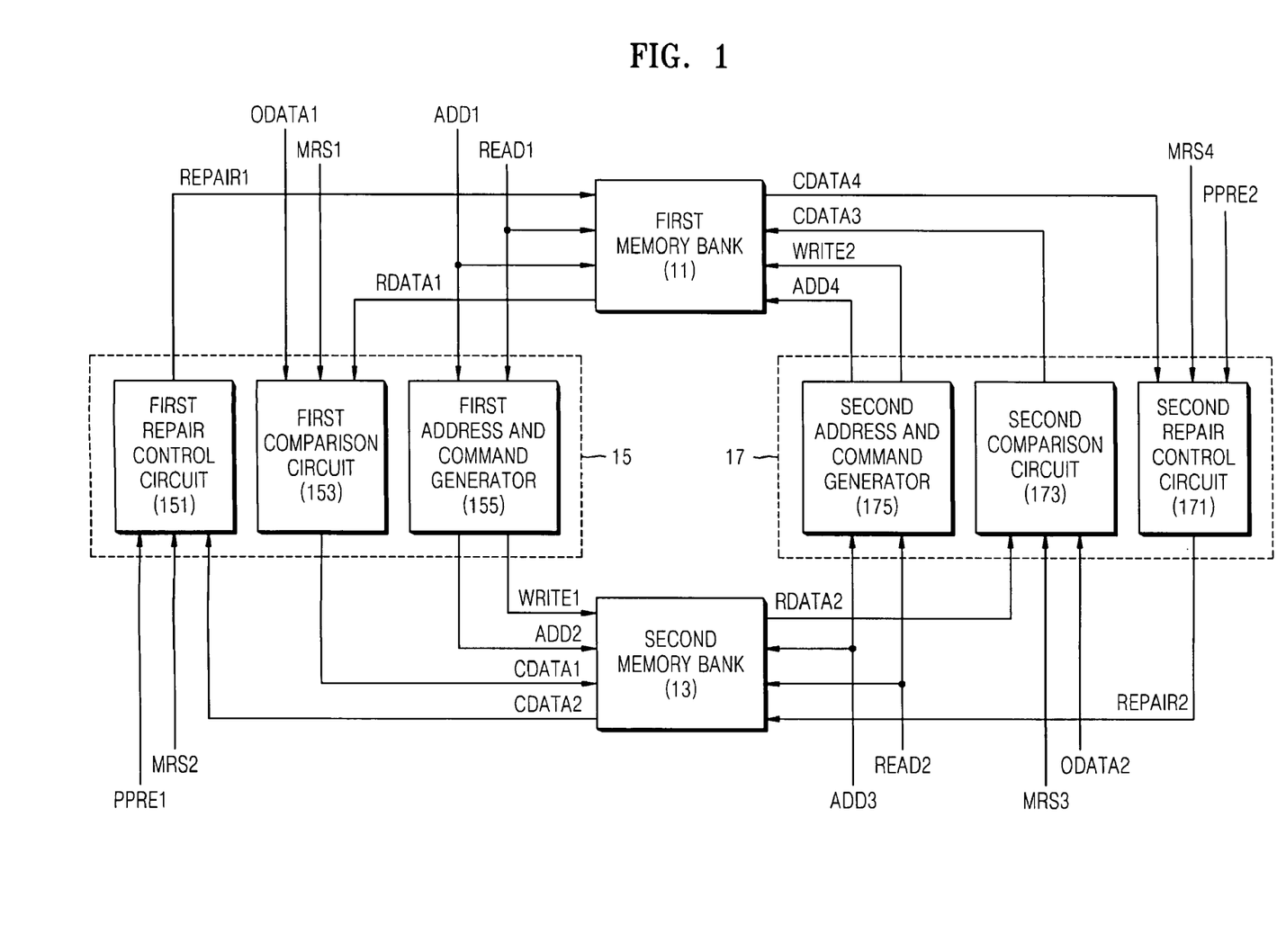
FIG. 1 is a block diagram of a semiconductor memory device according to a first embodiment of the present invention.

FIG. 1 is a block diagram of a semiconductor memory device according to a first embodiment of the present invention. Referring to FIG. 1, the semiconductor memory device includes a first memory bank 11, a second memory bank 13, a first post package repair control circuit 15, and a second post package repair control circuit 17.

The first and second memory banks 11 and 13 are dynamic random access memories (DRAMs) each including normal memory cells and redundancy memory cells for performing repairs. The memory device illustrated in FIG. 1 is constructed in such a manner that the second memory bank 13 is used as a fail bit map memory for storing failed bit information regarding the first memory bank 11, and the first memory bank 11 is used as a fail bit map memory for storing failed bit information regarding the second memory bank 13 in a post package repair mode. Although FIG. 1 illustrates two memory banks, it would be apparent to those of ordinary skill in the art that more than two memory banks can be included in the semiconductor memory device of FIG. 1.

The first post package repair control circuit 15 repairs the first memory bank 11 by using the second memory bank 13 as a fail bit map memory for the first memory bank 11. The first post package repair control circuit 15 includes a first repair control circuit 151, a first comparison circuit 153, and a first address and command generator 155.

In a post package repair mode, the first comparison circuit 153 compares data RDATA1 read from the first memory bank 11 with external data ODATA1 received from the outside and provides comparison result data CDATA1 indicating the result of comparison to the second memory bank 13, in response to a first control signal MRS1. The read data RDATA1 is read from the first memory bank 11 in response to an address ADD1 and a read command READ1 received from the outside. The read data RDATA1 is obtained by reading predetermined data previously written to the first memory bank 11 in order to test the first memory bank 11, and the external data ODATA1 is the same as the predetermined data.

In the post package repair mode, if the address ADD1 and the read command READ1 regarding the first memory bank 11 are input to the first address and command generator 155, an address ADD2 and a write command WRITE1 regarding the second memory bank 13 are automatically generated by the first address and command generator 155. Thus the comparison result data CDATA1 is stored in the second memory bank 13 in response to the address ADD2 and the write command WRITE1.

In the post package repair mode, the first repair control circuit 151 determines whether data CDATA2 read from the second memory bank 13, i.e., the result of reading the comparison result data CDATA1 from the second memory bank 13, contains abnormal data representing failed bits and then controls failed memory cells included in the first memory bank 11 to be repaired according to the result of determination, in response to a second control signal MRS2.

The data CDATA2 is read from the second memory bank 13 in response to an address (not shown) and a read command (not shown) regarding the second memory bank 13, which are received from the outside. If the address regarding the second memory bank 13 is input to the first address and command generator 155, an address (not shown) regarding the first memory bank 11 is automatically generated by the first address and command generator 155. The address regarding the first memory bank 11 is used to access the first memory bank 11 in order to repair failed memory cells in the first memory bank 11.

The second post package repair control circuit 17 repairs the second memory bank 13 by using the first memory bank 11 as a fail bit map memory for the second memory bank 13. The second post package repair control circuit 17 includes a second repair control circuit 171, a second comparison circuit 173, and a second address and command generator 175.

In the post package repair mode, the second comparison circuit 173 compares read data RDATA2 read from the second memory bank 13 with external data ODATA2 received from the outside and then provides comparison result data CDATA3 indicating the result of comparison to the first memory bank 11, in response to a third control signal MRS3. The read data RDATA2 is read from the second memory bank 13 in response to an address ADD3 and a read command READ2 that are received from the outside. The read data RDATA2 is obtained by reading predetermined data previously written to the second memory bank 13 in order to test the second memory bank 13, and the external data ODATA2 is the same as the predetermined data.

In post package repair mode, if the address ADD3 and the read command READ2 regarding the second memory bank 13 are input to the second address and command generator 175, an address ADD4 and a write command WRITE2 regarding the first memory bank 11 are automatically generated in the second address and command generator 175. Thus the comparison result data CDATA3 is stored in the first memory bank 11 in response to the address ADD4 and the write command WRITE2.

In the post package repair mode, the second repair control circuit 171 determines whether data CDATA4 read from the first memory bank 11, i.e., the result of reading the comparison result data CDATA3 from the first memory bank 11, contains abnormal data representing failed bits and then controls failed memory cells included in the second memory bank 13 to be repaired according to the result of the determination, in response to a fourth control signal MRS4.

The data CDATA4 is read from the first memory bank 11 in response to an address (not shown) and a read command (not shown) regarding the first memory bank 11, which are received from the outside. If the address regarding the first memory bank 11 is input to the second address and command generator 175, an address (not shown) regarding the second memory bank 13 is automatically generated in the second address and command generator 175. The address regarding the second memory bank 13 is used to access the second memory bank 13 in order to repair failed memory cells included in the second memory bank 13.

The first through fourth control signals MRS1 through MRS4 are output from a mode register set (MRS) included in the semiconductor memory device and can be controlled from the outside of the semiconductor memory device.

Figure 2:
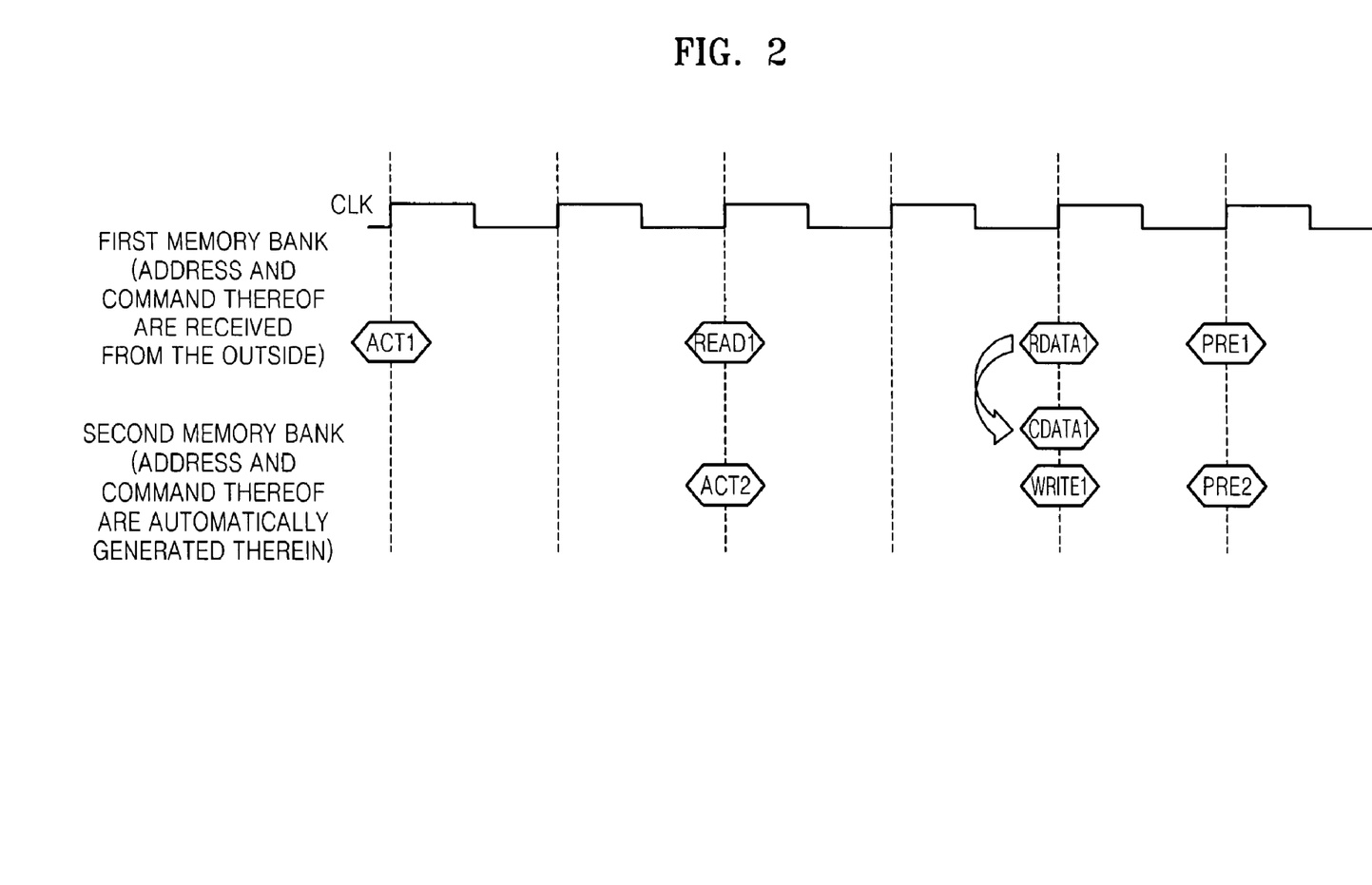
FIGS. 2 and 3 are timing diagrams illustrating operations of the semiconductor memory device illustrated in FIG. 1 in a post package repair mode.
Figure 3:
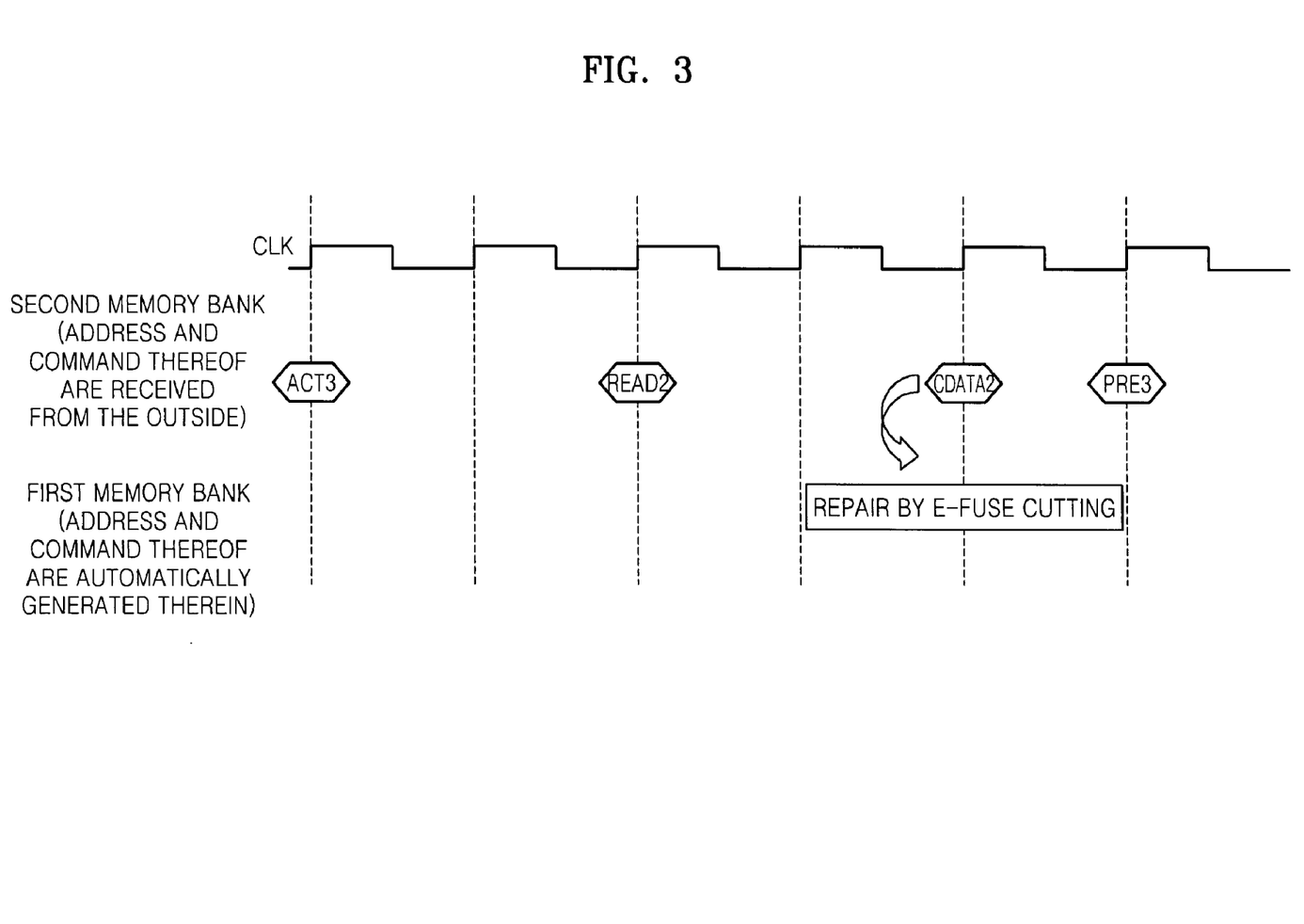

FIGS. 2 and 3 are timing diagrams illustrating operations of the semiconductor memory device illustrated in FIG. 1 in a post package repair mode. In detail, FIG. 2 is a timing diagram illustrating the operation of comparing read data RDATA1 read from the first memory bank 11 with external data ODATA1 received from the outside in the post package repair mode and then writing comparison result data CDATA1 indicating the result of comparison to the second memory bank 13. FIG. 3 is a timing diagram illustrating the operation of determining whether data CDATA2 read from the second memory bank 13 contains abnormal data representing failed bits and then repairing failed memory cells of the first memory bank 11 according to the result of determination, in the post package repair mode.

A post package repair method performed on the semiconductor memory device illustrated in FIG. 1 according to the first embodiment of the present invention, that is, the post package repair method according to the first embodiment of the present invention, will now be described with reference to FIGS. 2 and 3.

First, predetermined data is written to the first memory bank 11 in order to test the first memory bank 11. Next, as illustrated in FIG. 2, the first memory bank 11 is activated (ACT1), and data RDATA1 is read from the first memory bank 11 when an address ADD1 and a read command READ1 regarding the first memory bank 11 are received from the outside after a predetermined cycle of a clock signal CLK.

Next, if comparison data ODATA1 that is identical to the predetermined data is received from the outside, the first comparison circuit 153 compares the comparison data ODATA1 with the data RDATA1 read from the first memory bank 11 and generates comparison result data CDATA1. The comparison result data CDATA1 contains failed bit information regarding the first memory bank 11.

For example, if the comparison data ODATA1 received from the outside and the data RDATA1 read from a predetermined memory cell of the first memory bank 11 are the same, the comparison result data CDATA1 goes logic "1" thus indicating that the memory cell has not failed. However, if the comparison data ODATA1 and the data RDATA1 are not the same, the comparison result data CDATA1 goes logic "0" thus indicating that the memory cell has failed.

Next, the second memory bank 13 is activated (ACT2), an address ADD2 and a write command WRITE1 regarding the second memory bank 13 are automatically generated in the first address and command generator 155, and the comparison result data CDATA1 is stored in the second memory bank 13 in response to the address ADD2 and the write command WRITE1.

Next, as illustrated in FIG. 3, the second memory bank 13 is activated again (ACT3), an address (not shown) and a read command READ2 are applied to the second memory bank 13 after a predetermined cycle of a clock signal CLK, and then, data CDATA2 is obtained by reading the comparison result data CDATA1 from the second memory bank 13.

Next, it is determined whether the data CDATA2 that is the result of reading the comparison result data CDATA1 from the second memory bank 13 contains abnormal data representing failed bit information. If the result of determination reveals that abnormal data representing failed bit information is included, failed memory cells included in the first memory bank 11 that correspond to the abnormal data are repaired using electrical fuse cutting. Performing repairs by using electrical fuse cutting is considered obvious to those of ordinary skill in the art and thus a description thereof will be omitted.

Likewise, failed memory cells in the second memory bank 13 are repaired using the second post package repair control circuit 17.

As described above, in the semiconductor memory device and the post package repair method according to the first embodiment of the present invention, a second memory bank 13 is used as a fail bit map memory for storing failed bit information regarding the first memory bank 11 and the first memory bank 11 is used as a fail bit map memory for storing failed bit information regarding the second memory bank 13 in the post package repair mode. Thus expensive test equipment having a fail bit map memory is not needed for performing post package repairs, and the post package repairs can be continuously performed while conducting a mass-production package test using general mass-production test equipment.

Figure 4:
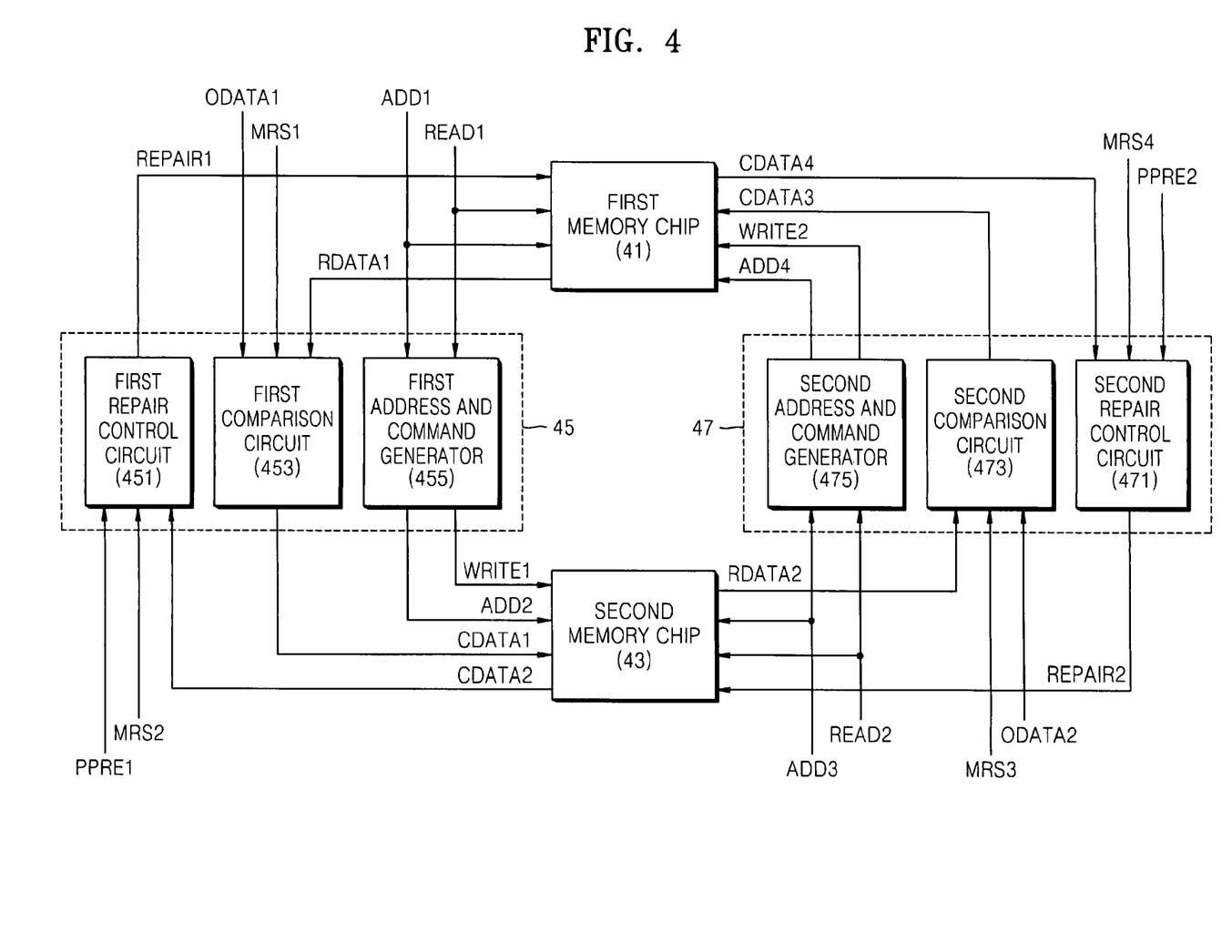
FIG. 4 is a block diagram of a semiconductor memory device according to a second embodiment of the present invention.

FIG. 4 is a block diagram of a semiconductor memory device according to a second embodiment of the present invention. Referring to FIG. 4, the semiconductor memory device includes a first memory chip 41, a second memory chip 43, a first post package repair control circuit 45, and a second post package repair control circuit 47.

In the semiconductor memory device according to the second embodiment, the first memory chip 41 and the second memory chip 43 are packaged together into a single package as a dual die package (DDP) memory device. However, the first memory chip 41 and the second memory chip 43 may be individually packaged if needed.

In the semiconductor memory device according to the second embodiment, the second memory chip 43 is used as a fail bit map memory for storing failed bit information regarding the first memory chip 41, and the first memory chip 41 is used as a fail bit map memory for storing failed bit information regarding the second memory chip 43 in the post package repair mode. Although FIG. 4 illustrates two memory chips, it is obvious that more than two memory chips can be included in the semiconductor memory device.

The first post package repair control circuit 45 is used to repair the first memory chip 41 by using the second memory chip 43 as a fail bit map memory for the first memory chip 41. The operation of the first post package repair control circuit 45 is the same as that of the first post package repair control circuit 15 illustrated in FIG. 1. The first post package repair control circuit 45 includes a first repair control circuit 451, a first comparison circuit 453, and a first address and command generator 455. The operations of the first repair control circuit 451, the first comparison circuit 453, and the first address and command generator 455 are respectively the same as those of the first repair control circuit 151, the first comparison circuit 153, and the first address and command generator 155 illustrated in FIG. 1.

The second post package repair control circuit 47 is used to repair the second memory chip 43 by using the first memory chip 41 as a fail bit map memory for the second memory chip 43. The operation of the second post package repair control circuit 47 is the same as that of the second post package repair control circuit 17 illustrated in FIG. 1. The second post package repair control circuit 47 includes a second repair control circuit 471, a second comparison circuit 473, and a second address and command generator 475. The operations of the second repair control circuit 471, the second comparison circuit 473, and the second address and command generator 475 are respectively the same as those of the second repair control circuit 171, the second comparison circuit 173, and the second address and command generator 175 illustrated in FIG. 1.

Figure 5:
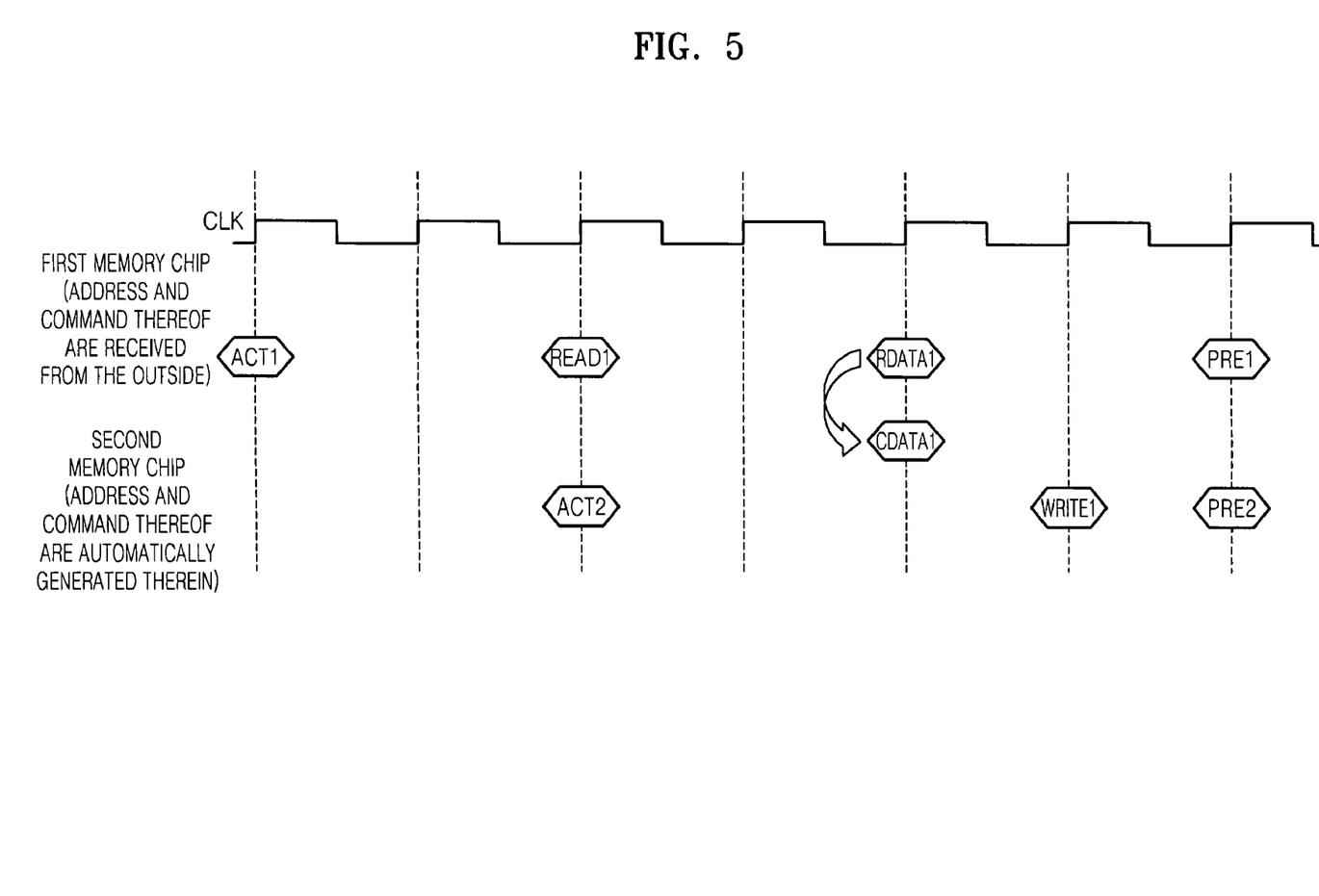
FIGS. 5 and 6 are timing diagrams illustrating operations of the semiconductor memory device illustrated in FIG. 4 in the post package repair mode.
Figure 6:
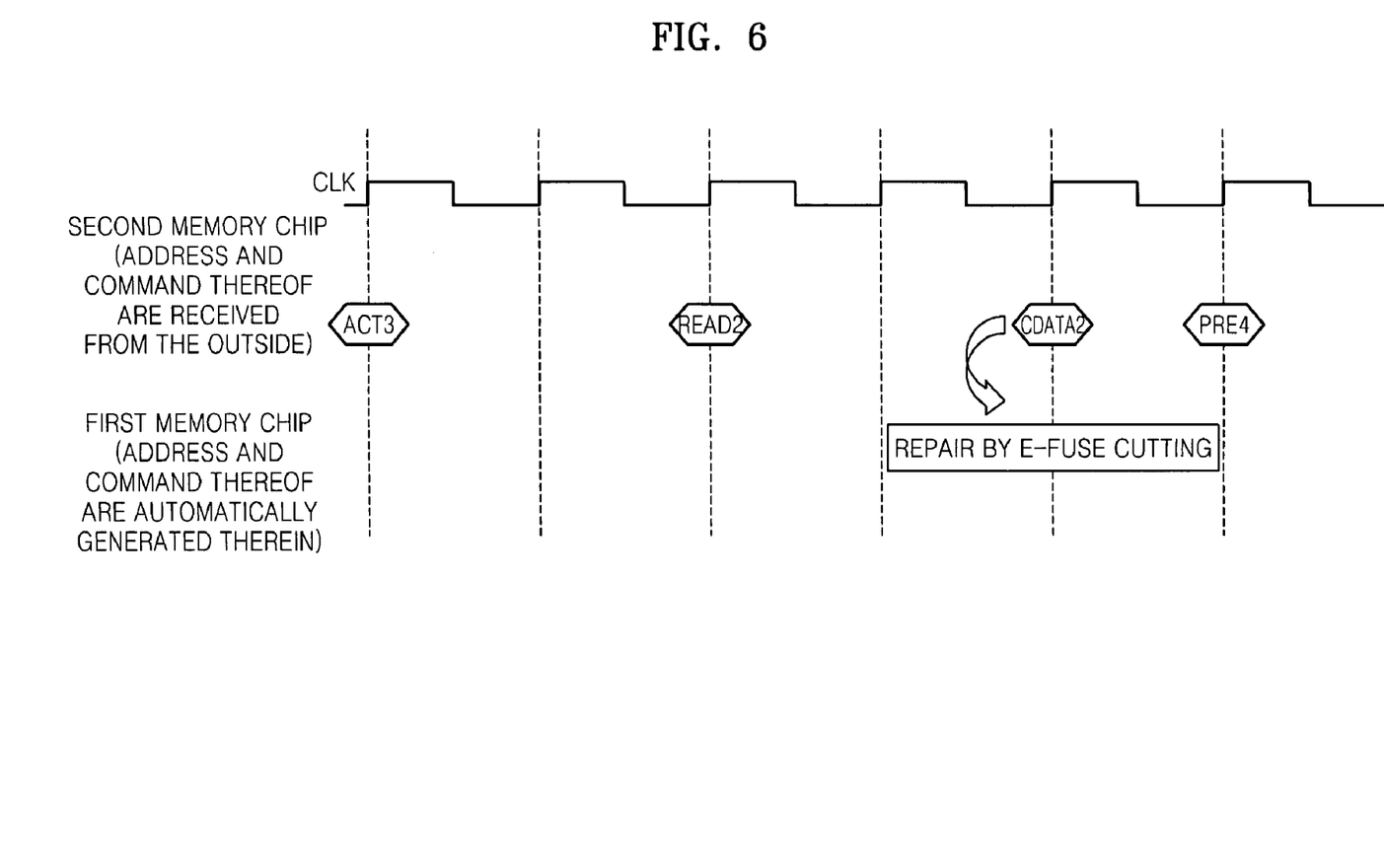

FIGS. 5 and 6 are timing diagrams illustrating the operations of the semiconductor memory device illustrated in FIG. 4 in the post package repair mode. In detail, FIG. 5 is a timing diagram illustrating the operation of comparing read data RDATA1 read from the first memory chip 41 with external data ODATA1 received from the outside and then writing comparison result data CDATA1 to the second memory chip 43 in the post package repair mode. FIG. 6 is a timing diagram illustrating the operation of determining whether data CATA2 read from the second memory chip 43 contains abnormal data representing failed bits and then repairing failed memory cells included in the first memory chip 41 according to the result of determination in the post package repair mode.

A post package repair method performed on the memory device illustrated in FIG. 4 according to the second embodiment of the present invention, that is, a post package repair method according to the second embodiment of the present invention, will now be described with reference to FIGS. 5 and 6.

First, predetermine data is written to the first memory chip 41 in order to test the first memory chip 41. Next, as illustrated in FIG. 5, the first memory chip 41 is activated (ACT1) and then data RDATA1 is read from the first memory chip 41 when an address ADD1 and a read command READ1 regarding the first memory chip 41 are received from the outside after a predetermined cycle of a clock signal CLK.

Next, if comparison data CDATA1 that is identical to the predetermined data is received from the outside, the first comparison circuit 453 compares the comparison data ODATA1 with the data RDATA1 read from the first memory chip 41 and then generates comparison result data CDATA1. The comparison result data CDATA1 contains failed bit information regarding the first memory chip 41.

For example, if the comparison data ODATA1 received from the outside is the same as the data RDATA1 read from a predetermined memory cell in the first memory chip 41, the comparison result data CDATA1 goes logic "1" thus indicating that the memory cell has not failed. However, if the comparison data ODATA1 is not the same as the data RDATA1, the comparison result data CDATA1 goes logic "0" thus indicating that the memory cell has failed.

Next, the second memory chip 43 is activated (ACT2), and then if an address ADD2 and a write command WRITE1 regarding the second memory chip 43 are automatically generated in the first address and command generator 455 and the comparison result data CDATA1 is stored in the second memory chip 43 in response to the address ADD2 and the write command WRITE1.

Next, as illustrated in FIG. 6, the second memory chip 43 is activated again (ACT3), an address (not shown) and a read command READ2 are applied to the second memory chip 43 after a predetermined cycle of a clock signal CLK, and then, data CDATA2 is obtained by reading the comparison result data CDATA1 from the second memory chip 43 when an address (not shown) and a read command READ2 regarding the second memory chip 43 are received from the outside after a predetermined cycle of a clock signal CLK.

Next, it is determined whether the data CDATA2, that is, the result of reading the comparison result data CDATA1 from the second memory chip 43, contains abnormal data representing failed bit information. If the result of determination reveals that the abnormal data representing the failed bit information is included, failed memory cells in the first memory chip 41 that correspond to the abnormal data are repaired using electrical fuse cutting.

Likewise, failed memory cells included in the second memory chip 43 are repaired using the second post package repair control circuit 47.

As described above, in the semiconductor memory device and the post package repair method according to the second embodiment of the present invention, the second memory chip 43 is used as a fail bit map memory for storing failed bit information regarding the first memory chip 41, and the first memory chip 41 is used as a fail bit map memory for storing failed bit information regarding the second memory chip 43 in the post package repair mode. Accordingly, expensive test equipment having a fail bit map memory is not needed for performing post package repairs, and the post package repairs can be continuously performed while conducting a mass-production package test using general mass-production test equipment.

As described above, in a semiconductor memory device and a post package repair method according to the present invention, expensive test equipment having a fail bit map memory is not needed and post package repairs can be continuously performed while conducting a mass-production package test using general mass-production test equipment. Accordingly, it is possible to reduce manufacturing costs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
   a first memory bank;
   a second memory bank; and
   a post package repair control circuit comparing data read from the first memory bank with data received from the outside, providing comparison result data to the second memory bank in order to store the comparison result data in the second memory bank, determining whether a result of reading the comparison result data from the second memory bank contains abnormal data representing failed bits, and controlling failed memory cells included in the first memory bank to be repaired according to a result of the determination, in a post package repair mode.

2. The device of claim 1, wherein the post package repair control circuit comprises:
   a comparison circuit comparing the data read from the first memory bank with the data received from the outside and providing a result of the comparing to the second memory bank, in response to a first control signal received in the post package repair mode; and
   a repair control circuit determining whether a result of reading the comparison result data read from the second memory bank contains abnormal data representing failed bits and then controlling failed memory cells included in the first memory bank to be repaired, in response to a second control signal received in the post package repair mode.

3. The device of claim 2, wherein the post package repair control circuit further comprises an address and command generator in which an address and a write command regarding the second memory bank are automatically generated if an address and a read command regarding the first memory bank received from the outside are input to the address and command generator in the post package repair mode, and
   the comparison result data is stored in the second memory bank in response to the address and the write command regarding the second memory bank.

4. A semiconductor memory device comprising:
   a first memory bank;
   a second memory bank;
   a first post package repair control circuit comparing first read data read from the first memory bank with first external data received from the outside, providing first comparison result data indicating a result of the comparing to the second memory bank in order to store the first comparison result data in the second memory bank, determining whether a result of reading the first comparison result data from the second memory bank contains abnormal data representing failed bits, and controlling failed memory cells included in the first memory bank to be repaired, in a post package repair mode; and
   a second post package repair control circuit comparing second read data read from the second memory bank with second external data received from the outside, providing second comparison result data indicting a result of the comparing to the first memory bank in order to store the second comparison result data in the first memory bank, determining whether a result of reading the second comparison result data from the first memory bank contains abnormal data representing failed bits, and controlling failed memory cells included in the second memory bank to be repaired.

5. The device of claim 4, wherein the first post package repair control circuit comprises:
   a first comparison circuit comparing the first read data with the first external data and providing the first comparison result data indicating a result of the comparing to the second memory bank, in response to a first control signal received in the post package repair mode; and
   a first repair control circuit determining whether a result of reading the first comparison result from the second memory bank contains abnormal data representing failed bits and controlling failed memory cells included in the first memory bank to be repaired, in response to a second control signal received in the post package repair mode.

6. The device of claim 5, wherein the first post package repair control circuit further comprises a first address and command generator in which a second address and a first write command regarding the second memory bank are automatically generated if a first address and a first read command regarding the first memory bank received from the outside are input to the first address and command generator in the post package repair mode, and the first comparison result data is stored in the second memory bank in response to the second address and the first write command.

7. The device of claim 4, wherein the second post package repair control circuit comprises:

a second comparison circuit comparing the second read data with the second external data and providing the second comparison result data indicating a result of the comparing to the first memory bank, in response to a third control signal received in the post package repair mode; and a second repair control circuit determining whether a result of reading the second comparison result data from the first memory bank contains abnormal data representing failed bits and controlling failed memory cells included in the second memory bank to be repaired, in response to a fourth control signal received in the post package repair mode.

8. The device of claim 7, wherein the second post package repair control circuit further comprises a second address and command generator in which a second address and a first write command regarding the first memory bank are automatically generated if a first address and a first read command regarding the second memory bank received from the outside are input to the second address and command generator in the post package repair mode, wherein the second comparison result data is stored in the first memory bank in response to the second address and the first write command.

9. A semiconductor memory device comprising:
a first memory bank; and
a second memory bank,
wherein in a post package repair mode, the second memory bank is used as a fail bit map memory for storing failed bit information regarding the first memory bank, and the first memory bank is used as a fail bit map memory for storing failed bit information regarding the second memory bank.

10. A dual die package memory device comprising:
a first memory chip;
a second memory chip; and
a post package repair control circuit comparing data read from the first memory chip with data received from the outside, providing comparison result data indicating a result of the comparing to the second memory chip in order to store the comparison result data in the second memory chip, determining whether a result of reading the comparison result data from the second memory chip contains abnormal data representing failed bits, and controlling failed memory cells included in the first memory chip to be repaired, in a post package repair mode.

11. The device of claim 10, wherein the post package repair control circuit comprises:

a comparison circuit comparing data read from the first memory chip with the data received from the outside, and providing comparison result data indicating a result of the comparing to the second memory chip, in response to a first control signal received in the post package repair mode; and a repair control circuit determining whether a result of reading the comparison result data from the second memory chip contains abnormal data representing failed bits and controlling failed memory cells included in the first memory chip to be repaired, in response to a first control signal received in the post package repair mode.

12. The device of claim 11, wherein the post package repair control circuit further comprises an address and command generator in which an address and a write command regarding the second memory chip are automatically generated if an address and a read command regarding the first memory chip received from the outside are input to the address and command generator in the post package repair mode, and the comparison result data is stored in the second memory chip in response to the address and the write command regarding the second memory chip.

13. A dual die package memory device comprising:
a first memory chip;
a second memory chip;
a first post package repair control circuit comparing first read data read from the first memory chip with first external data received from the outside, providing first comparison result data indicating a result of the comparing to the second memory chip in order to store the first comparison result data in the second memory chip, determining whether a result of reading the first comparison result data from the second memory chip contains abnormal data representing failed bits, and controlling failed memory cells included in the first memory chip to be repaired, in a post package repair mode; and a second post package repair control circuit comparing second read data read from the second memory chip with second external data received from the outside, providing second comparison result data indicating a result of the comparing to the first memory chip in order to store the second comparison result data in the first memory chip, determining whether a result of reading the second comparison result data from the first memory chip contains abnormal data representing failed bits, and controlling failed memory cells included in the second memory chip to be repaired, in the post package repair mode.

14. The device of claim 13, wherein the first post package repair control circuit comprises:

a first comparison circuit comparing the first read data with the first external data, and providing the first comparison result data indicating a result of the comparing to the second memory chip, in response to a first control signal received in the post package repair mode; and a first repair control circuit determining whether a result of reading the first comparison result data from the second memory chip contains abnormal data representing failed bits and controlling failed memory cells included in the first memory chip to be repaired, in response to a second control signal received in the post package repair mode.

15. The device of claim 14, wherein the first post package repair control circuit further comprises a first address and command generator in which a second address and a first write command regarding the second memory chip are automatically generated if a first address and a first read command regarding the first memory chip received from the outside are input to the first address and command generator in the post package repair mode, and the first comparison result data is stored in the second memory chip in response to the second address and the first write command.

16. The device of claim 13, wherein the second post package repair control circuit comprises:
a second comparison circuit comparing the second read data with the second external data, and providing the second comparison result data indicating a result of the comparing to the first memory chip, in response to a third control signal received in the post package repair mode; and
a second repair control circuit determining whether a result of reading the second comparison result data from the first memory chip contains abnormal data representing failed bits and controlling failed memory cells included in the second memory chip to be repaired, in response to a fourth control signal received in the post package repair mode.

17. The device of claim 16, wherein the second post package repair control circuit further comprises a second address and command generator in which a second address and a first write command regarding the first memory chip are automatically generated if a first address and a first read command regarding the second memory chip received from the outside are input to the second address and command generator in the post package repair mode, and
the second comparison result data is stored in the first memory chip in response to the second address and the first write command.

18. A dual die package memory device comprising:
a first memory chip; and
a second memory chip,
wherein in a post package repair mode, the second memory chip is used as a fail bit map memory for storing failed bit information regarding the first memory chip, and the first memory chip is used as a fail bit map memory for storing failed bit information regarding the second memory chip.

19. A post package repair method related to a semiconductor memory device having a first memory bank and a second memory bank, the method comprising:
writing first data to the first memory bank and then reading the first data from the first memory bank;
receiving first comparison data that is identical to the first data;
comparing a result of reading the first data from the first memory bank with the first comparison data;
storing first comparison result data containing failed bit information regarding the first memory bank in the second memory bank;
reading the first comparison result data from the second memory bank;
determining whether a result of reading the first comparison result data from the second memory bank contains abnormal data representing failed bit information; and
if it is determined that abnormal data representing failed bit information is included, repairing failed memory cells included in the first memory bank which correspond to the abnormal data.

20. The method of claim 19, further comprising:
writing second data to the second memory bank and then reading the second data from the second memory bank;
receiving second comparison data that is identical to the second data;
comparing a result of reading the second data from the second memory bank with the second comparison data;
storing second comparison result data containing failed bit information regarding the second memory bank in the first memory bank;
reading the second comparison result data from the first memory bank;
determining whether a result of reading the second comparison result data from the first memory bank contains abnormal data representing failed bit information; and
if it is determined that abnormal data representing failed bit information is included, repairing failed memory cells included in the second memory bank which correspond to the abnormal data.

21. The method of claim 19 being continuously performed while conducting a mass-production package test on the semiconductor memory device.

22. A post package repair method related to a dual die package memory device having a first memory chip and a second memory chip, the method comprising:
writing first data to the first memory chip and then reading the first data from the first memory chip;
comparing a result of reading the first data from the first memory chip with first comparison data that is identical to the first data;
storing first comparison result data containing failed bit information regarding the first memory chip in the second memory chip;
reading the first comparison result data from the second memory chip;
determining whether a result of reading the first comparison result data from the second memory chip contains abnormal data representing failed bit information; and
if it is determined that abnormal data representing failed bit information is included, repairing failed memory cells included in the first memory chip which correspond to the abnormal data.

23. The method of claim 22, further comprising:
writing second data to the second memory chip and then reading the second data from the second memory chip;
comparing a result of reading the second data from the second memory chip with second comparison data that is identical to the second data;
storing second comparison result data containing failed bit information regarding the second memory chip in the first memory chip;
reading the second comparison result data from the first memory chip;
determining whether a result of reading the second comparison result data from the first memory chip contains abnormal data representing failed bit information; and
if it is determined that abnormal data representing failed bit information is included, repairing failed memory cells included in the second memory chip which correspond to the abnormal data.

24. The method of claim 22 being continuously performed while conducting a mass-production package test on the dual dip package memory device.

* * * * *